United States Patent
Lee (10) Patent No.: US 7,366,026 B2
(45) Date of Patent: Apr. 29, 2008

(54) FLASH MEMORY DEVICE AND METHOD FOR FABRICATING THE SAME, AND PROGRAMMING AND ERASING METHOD THEREOF

(75) Inventor: Sang Bum Lee, Incheon (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 10/879,722

(22) Filed: Jun. 30, 2004

(65) Prior Publication Data

US 2005/0236662 A1 Oct. 27, 2005

(30) Foreign Application Priority Data

Apr. 23, 2004 (KR) .................. 10-2004-0028282

(51) Int. Cl.
*G11C 16/04* (2006.01)
*H01L 21/82* (2006.01)

(52) U.S. Cl. ............... 365/185.29; 257/314; 257/315; 257/E21.182; 257/E21.267; 365/185.18; 365/185.24; 438/157; 438/176

(58) Field of Classification Search ............... 257/314, 257/365; 438/157, 176; 365/185.24, 185.29
See application file for complete search history.

(56) References Cited

U.S. PATENT DOCUMENTS

| | | | | |
|---|---|---|---|---|
| 6,259,142 B1 * | 7/2001 | Dawson et al. | ............. | 257/365 |
| 6,531,350 B2 * | 3/2003 | Satoh et al. | ................. | 438/197 |
| 6,586,296 B1 * | 7/2003 | Watt | ........................... | 438/224 |
| 6,822,926 B2 * | 11/2004 | Kanai et al. | ................. | 257/314 |
| 6,939,767 B2 * | 9/2005 | Hoefler et al. | .............. | 438/267 |
| 6,949,788 B2 * | 9/2005 | Fujiwara et al. | ............. | 257/314 |
| 2001/0002712 A1 * | 6/2001 | Horiguchi et al. | .......... | 257/315 |

* cited by examiner

*Primary Examiner*—Dao H. Nguyen
(74) *Attorney, Agent, or Firm*—Sherr & Nourse, PLLC (57) ABSTRACT

A flash memory device of SONOS structure and a method for fabricating the same, and programming and erasing operation methods, to improve reliability such as endurance and retention, are disclosed, which includes a first conductive type semiconductor substrate; an ONO layer on the semiconductor substrate; a first control gate on the ONO layer; second and third control gates on the ONO layer at both sides of the first control gate; and source and drain regions in the surface of the semiconductor substrate at both sides of the second and third control gates.

7 Claims, 6 Drawing Sheets

FIG. 1
The related art

FLASH MEMORY DEVICE AND METHOD FOR FABRICATING THE SAME, AND PROGRAMMING AND ERASING METHOD THEREOF

This application claims the benefit of the Korean Application No. P2004-28282 filed on Apr. 23, 2004, which is hereby incorporated by reference.

BACKGROUND OF THE INVENTION

1. Field of the Invention

The present invention relates to a flash memory device, and more particularly, to a flash memory device having an SONOS (Polysilicon-Oxide-Nitride-Oxide-Semiconductor) structure and a method for fabricating the same, and programming and erasing methods thereof, to improve reliability such as endurance and retention.

2. Discussion of the Related Art

A typical example of a nonvolatile memory device, in which data is not erased even though a voltage is not applied, is EEPROM (Electrically Erasable Programmable Read Only Memory). Generally, the EEPROM takes a scheme using a floating gate-type cell. With rapid development of high-integration device, it necessarily requires the decrease in a size of the floating gate-type cell according to the related art. However, it is impossible to decrease the cell size since it requires a high voltage on programming and erasing modes and it is difficult to obtain the margin of process for defining tunneling. In this reason, various nonvolatile memory devices such as SONOS, FeRAM, SET and NROM have been studied actively as the substitute for the floating gate-type cell. Among them, SONOS cell has attracted great attentions as the next nonvolatile memory device, which can substitute for the stacked floating gate-type cell.

Figure 1:
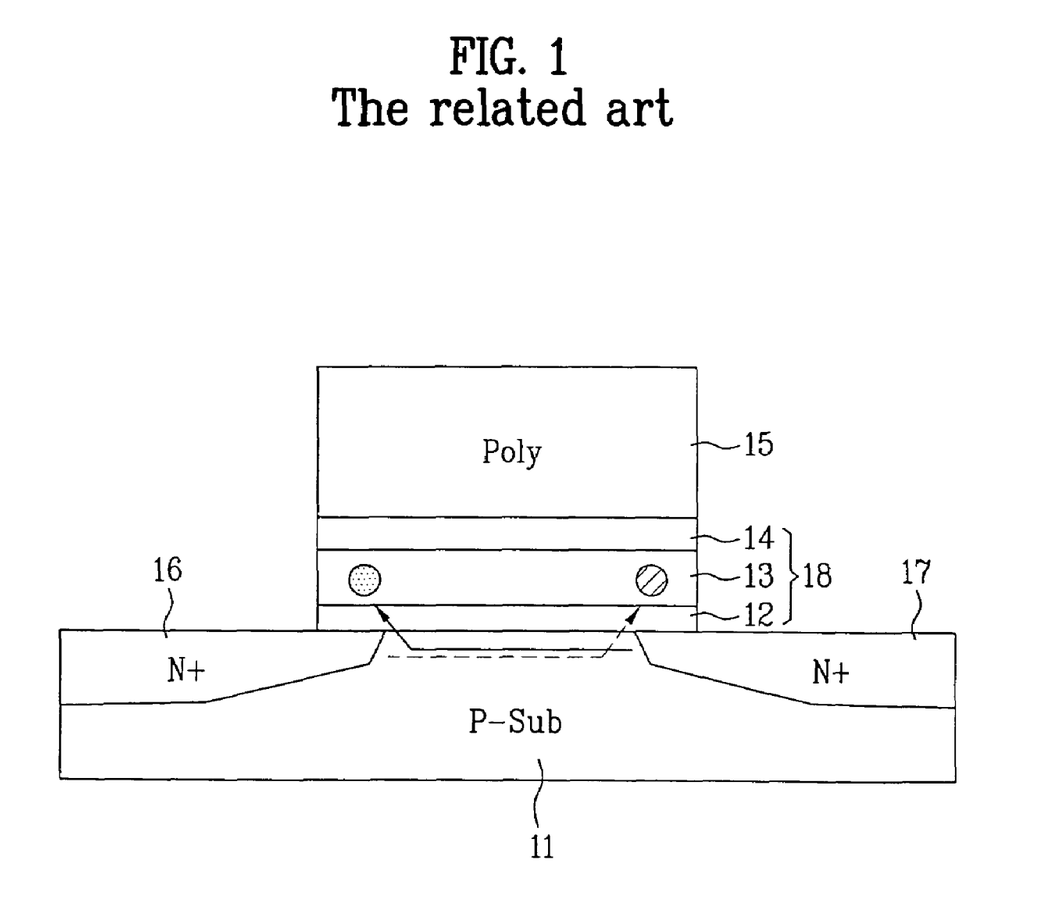
FIG. 1 is a cross-sectional view illustrating a related art SONOS-type flash memory device.

Hereinafter, a related art SONOS-type flash memory device will be described with reference to the accompanying drawings. FIG. 1 is a cross-sectional view illustrating a unit cell of a related art SONOS-type flash memory device.

As shown in FIG. 1, the SONOS-type flash memory device according to the related art includes a p-type semiconductor substrate 11, an ONO layer 18, a control gate 15, and source and drain regions 16 and 17. At this time, the ONO layer 18 is formed in a method of sequentially stacking a first oxide layer 12, a nitride layer 13 and a second oxide layer 14. Then, the control gate 15 is formed on the ONO layer 18, and the source and drain regions 16 and 17 are formed in a method of implanting highly doped n-type impurity ions into the surface of the semiconductor substrate 11 at both sides of the control gate 15. At this time, the first oxide layer 12 acts as a tunneling oxide layer, and the nitride layer 13 acts as a memory layer by controlling a threshold voltage Vth by charging electric charge to a trap site or discharging the electric charge. Also, the second oxide layer 14 acts as a blocking oxide layer preventing loss of the electric charge.

In the aforementioned SONOS-type flash memory device according to the related art, a programming operation uses a CHEI (Channel Hot Electron Injection) method, and an erasing operation uses an HHI (Hot Hole Injection) method to remove injected electrons.

On the programming operation, a predetermined positive (+) voltage is applied to the drain region 17 and the control gate 15, and the source region 16 and the semiconductor substrate (body) are ground. Under this condition, according as a bias is applied, channel electrons are accelerated by a lateral electric field formed from the source region 16 to the drain region 17, whereby the channel electrons become hot electrons around the drain region 17. Also, the hot electrons jump over a potential barrier of the first oxide layer 12, and are locally trapped to a trap level of the nitride layer 13 around the drain region 17, thereby increasing the threshold voltage. This programming method is referred to as CHEI (Channel Hot Electron Injection).

On the erasing operation, a predetermined positive (+) voltage is applied to the drain region 17, and a predetermined negative (−) voltage is applied to the control gate 15. Also, the source region 16 and the semiconductor substrate (body) 11 are ground. Under this condition, according as a bias is applied, a depletion region is formed in the n-type drain region 17 by a high electric field formed in an overlap area between the drain region 17 and the control gate 15. In the depletion region, pairs of electron and hole are generated by band to band tunneling. Then, the electron escapes to the n-type region, and the hole is accelerated by a lateral electric field of the depletion region, whereby the hole is changed to a hot hole. The hot hole jumps over an energy barrier between the first oxide layer 12 and the semiconductor substrate 11, injected and trapped to a valance band of the nitride layer 13, thereby performing the erasing operation lowing the threshold voltage. This erasing method is referred to as HHI (Hot Hole Injection).

Also, the aforementioned SONOS-type flash memory device records 2-bit data in one cell. That is, the programming operation of the related art SONOS-type flash memory device uses the CHEI (Channel Hot Electron Injection) method, and the erasing operation thereof uses the HHI (Hot Hole Injection) method. By applying the voltage of the aforementioned condition, the electron is trapped to the nitride layer 13 around the drain region 17, thereby storing 1-bit data. Then, a predetermined positive (+) voltage is applied to the source region 16 and the control gate 15, and the drain region 17 and the semiconductor substrate (body) are ground, whereby hot electrons are generated around the source region 16. The hot electrons jump over the potential barrier of the first oxide layer 12, and are trapped to the nitride layer 13 around the source region 16, thereby storing 1-bit data.

In the programming and erasing operations, if the electron and hole are shallowly trapped to the nitride layer 13, program and erase cycling becomes low. Accordingly, the technology for overcoming this problem has been published in IEDM document (Novel Operation Schemes to Improve Device Reliability in a Localized Trapping Storage SONOS-Type Flash Memory, 2003).

On the programming operation, when the hot electrons jump over the potential barrier of the first oxide layer 12, and are trapped to the nitride layer 13 around the drain region 17, some of the hot electrons are deeply trapped to the nitride layer 13, and the other hot electrons are shallowly trapped to the nitride layer 13. Among them, the hot electrons shallowly trapped to the nitride layer 13 escape during a storage period due to a damage of the first oxide layer generated by the program and erase cycling, thereby generating loss of the electric charge.

According to IEDM document published in 2003, it is proposed to carry out an electrical anneal after Hot Electron Injection of the programming operation or after Hot Hole Injection of the erasing operation, to improve over-erase in state of the low threshold voltage, and to prevent loss of the electric charge in state of the high threshold voltage. On the erasing operation, after hole injection, the electron and hole are recombined in the erasing electrical anneal. On the programming operation, after electron injection, the electron shallowly trapped to the nitride layer is removed, and the electron deeply trapped to the nitride layer remains by the programming electrical anneal. In the erasing electrical anneal, as shown in FIG. 1, the source region 16 and the drain region 17 are ground, and the pulse (10 ms) of 10V is applied to the control gate 15. In the programming electrical anneal, the source region 16 and the drain region 17 are ground (0V), and the pulse (10 ms) of −4V is applied to the control gate 15.

However, the aforementioned IEDM document has the following problems.

On the programming operation, the electrons shallowly trapped to the nitride layer are removed by the programming electrical anneal, thereby decreasing loss of the electric charge. After programming, it is impossible to remove the hopping electrons moved (spread) to a lateral side by the programming electrical anneal. Accordingly, even in case of Hot Hole Injection in a large amount on the erasing operation, the trapped electrons are not removed completely, thereby degrading reliability. Especially, when separately programming data to the nitride layer around the source region and the drain region, for example, programming 2-bit data in one cell, the aforementioned problem becomes more serious.

SUMMARY OF THE INVENTION

Accordingly, the present invention is directed to a flash memory device and a method for fabricating the same, and programming and erasing methods that substantially obviates one or more problems due to limitations and disadvantages of the related art.

An object of the present invention is to provide a flash memory device and a method for fabricating the same, and programming and erasing methods, to completely remove hopping electrons moved (spread) to a lateral direction, after programming.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a flash memory device includes a first conductive type semiconductor substrate; an ONO layer on the semiconductor substrate; a first control gate on the ONO layer; second and third control gates on the ONO layer at both sides of the first control gate; and source and drain regions in the surface of the semiconductor substrate at both sides of the second and third control gates.

Furthermore, the flash memory device includes an insulating layer to insulate the first control gate from the second and third control gates.

Furthermore, the flash memory device includes a planarization insulating layer on an entire surface of the semiconductor substrate, and having respective contact holes in the first, second and third control gates and the source and drain regions; and a word line, first and second control lines, and first and second bit lines respectively connected with the first, second and third control gates and the source and drain regions through the respective contact holes.

In another aspect, a method for fabricating a flash memory device includes the steps of forming an ONO layer having a stacked structure of a first oxide layer, a nitride layer and a second oxide layer on a semiconductor substrate on which an active region is defined; forming a first control gate on the ONO layer; forming an insulating layer on the surface of the first control gate; forming second and third control gates on the ONO layer at both sides of the first control gate; and forming source and drain regions on the semiconductor substrate at both sides of the second and third control gates.

At this time, the second oxide layer is formed in a method of oxidizing the nitride layer.

Also, the insulating layer is formed in a method of oxidizing the exposed surface of the first control gate.

Also, the source and drain regions are formed in a method of implanting highly doped n-type impurity ions by using the first, second and third control gates as a mask.

Furthermore, the method includes the steps of forming a planarization insulating layer on the entire surface of the semiconductor substrate including the first, second and third control gates; forming respective contact holes by selectively removing the planarization insulating layer and the ONO layer to expose the first, second and third control gates and the source and drain regions; and forming a word line, first and second control lines, and first and second bit lines respectively connected with the first, second and third control gates and the source and drain regions through the respective contact holes.

At this time, the planarization insulating layer is formed of BPSG.

In another aspect, a programming method of a flash memory device of SONOS structure, the flash memory device including second and third control gates at both sides of a first control gate, source and drain regions in a surface of a semiconductor substrate at both sides of the second and third control gates, and ONO layers between the control gates and the semiconductor substrate, includes a first step of applying a high voltage pulse to the first and third control gates, and trapping hot electrons to the ONO layer around the drain region; and a second step of annealing the trapped electrons by applying a high voltage pulse to the first control gate.

In the first step, 0V is applied to the source region, a voltage over a threshold voltage is applied to the second control gate, a voltage pulse of 10V or more is applied to the first and third control gates, and a voltage of 4V or more is applied to the drain region.

In the second step, 0V is applied to the source and drain region, a voltage of −4V is applied to the second and third control gates, and a voltage pulse of −10V is applied to the first control gate.

Furthermore, the method includes a third step of trapping hot electrons to the ONO layer around the source region by applying a high voltage pulse to the first and second control gates.

In another aspect, an erasing method of a flash memory device of SONOS structure, the flash memory device including second and third control gates at both sides of a first control gate, source and drain regions in a surface of a semiconductor substrate at both sides of the second and third control gates, and ONO layers between the control gates and the semiconductor substrate, includes a first step of injecting a hole to the ONO layer around the source or drain region by applying a negative voltage to the second or third control gate; and a second step of annealing the injected hole applying a positive high voltage pulse to the first control gate, and applying a negative high voltage pulse to the second and third control gates.

In the first step, a voltage over 0V or 5V is applied to the source or drain region, a voltage over a threshold voltage is applied to the second or third control gate, and a voltage pulse of −3V or more is applied to the first/third or second control gate.

In the second step, 0V is applied to the source and drain regions, a voltage pulse of 10V is applied to the second and third control gates, and a voltage pulse (several tens ms) of −10V is applied to the first control gate, thereby removing electrons moved to a lateral side.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a flash memory device and a method for fabricating the same, and programming and erasing methods will be described with reference to the accompanying drawings.

Figure 2:
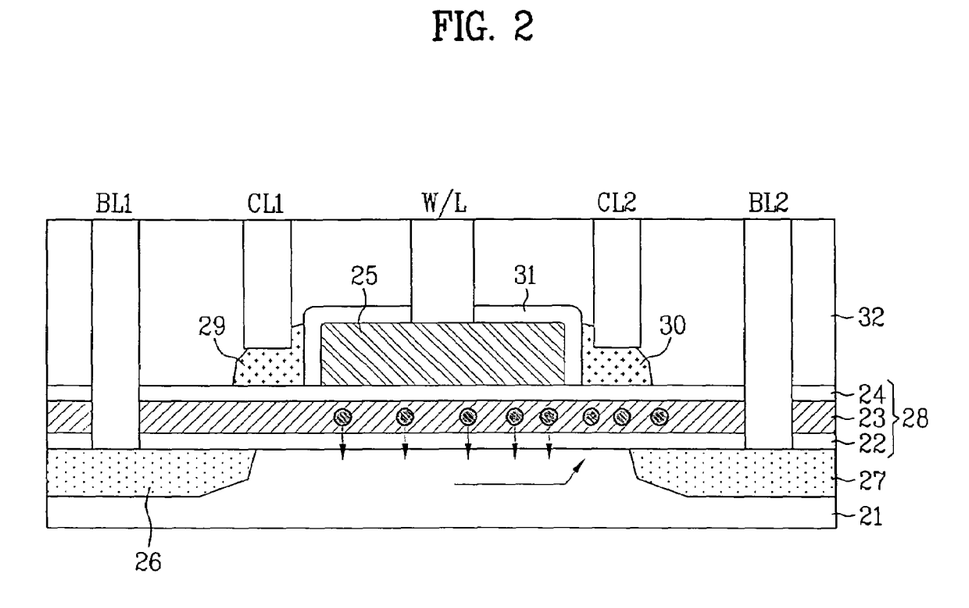
FIG. 2 is a cross-sectional view illustrating a flash memory device according to the present invention.

FIG. 2 is a cross-sectional view illustrating a flash memory device according to the present invention. In the flash memory device according to the present invention, as shown in FIG. 2, an ONO layer 28 is formed on a p-type semiconductor substrate 21, wherein the ONO layer 28 is formed by sequentially stacking a first oxide layer 22, a nitride layer 23, and a second oxide layer 24. Then, a first control gate 25 is formed on the ONO layer 28, and second and third control gates 29 and 30 are formed on the ONO layer 28 at both sides of the first control gate 25. After that, source and drain regions 26 and 27 are formed in the surface of the p-type semiconductor substrate 21 at both sides of the second and third control gates 29 and 30 by implantation of n-type impurity ions.

At this time, the first control gate 25 is isolated from the second and third control gates 29 and 30 by a third oxide layer 31. Then, a planarization insulating layer 32 is formed on an entire surface of the semiconductor substrate 21 including the first, second and third control gates 25, 29 and 30. Also, contact holes are respectively formed in the first, second and third control gates 25, 29 and 30 and the source and drain regions 26 and 27. In this state, a word line W/L and first and second control lines CL1 and CL2 are connected with the first, second and third control gates 25, 29 and 30 through the respective contact holes. Also, the source and drain regions 26 and 27 are connected with a first bit line BL1 and a second bit line BL2.

Also, the first oxide layer 22 acts as a tunneling oxide layer. The nitride layer 23 acts as a memory layer to charge the electric charge in a trap site, or to discharge the electric charge, whereby the nitride layer 23 has a memory function by controlling a threshold voltage Vth. Meanwhile, the second oxide layer 24 acts as a blocking oxide layer to prevent loss of the electric charge.

A method for fabricating the aforementioned flash memory device according to the present invention will be described as follows. FIG. 3A to FIG. 3H are cross-sectional views illustrating the fabrication process of the flash memory device according to the present invention.

Figure 3A:
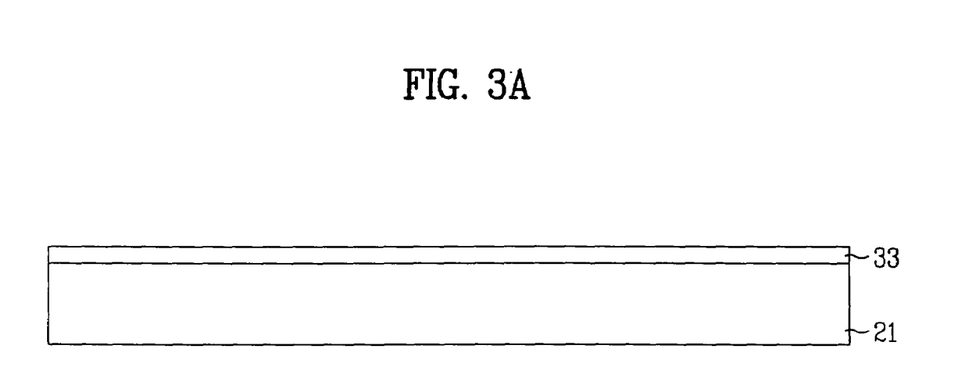
FIG. 3A to FIG. 3H are cross-sectional views illustrating the fabrication process of a flash memory device according to the present invention.

As shown in FIG. 3A, a p-type semiconductor substrate 21 is defined as a field region and an active region. Then, a field oxide layer (not shown) is formed in the field region of the p-type semiconductor substrate 21, and a buffer oxide layer 33 is formed on the p-type semiconductor substrate 21. Also, the process for ion implantation is progressed to form a well region (not shown) in the active region of the semiconductor substrate 21 and to control a threshold voltage.

Figure 3B:
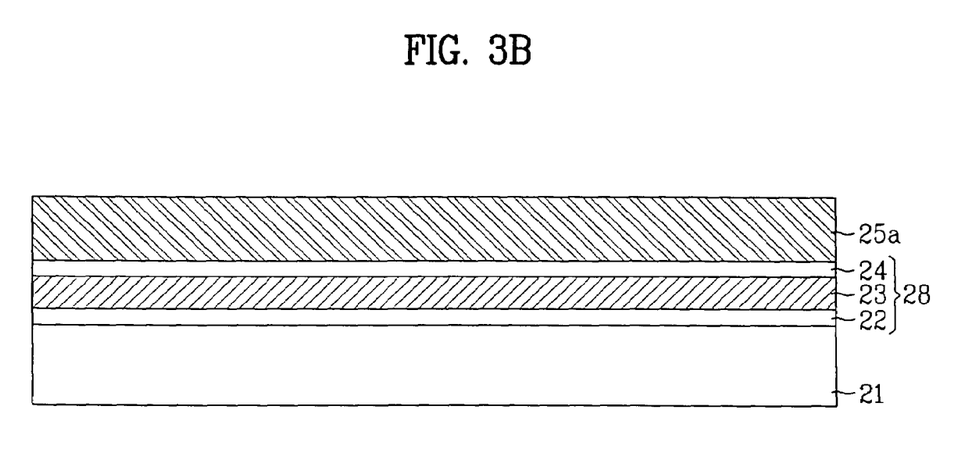

Referring to FIG. 3B, after removing the buffer oxide layer 33, a first oxide layer 22, a nitride layer 23 and a second oxide layer 24 are sequentially deposited on an entire surface of the semiconductor substrate 21 to form an ONO layer 28, wherein the first oxide layer 22 acts as a tunneling insulating layer, the nitride layer 23 locally traps electrons, and the second oxide layer 24 acts as a blocking layer. Then, a first polysilicon layer 25a is formed on the ONO layer 28. At this time, the second oxide layer 24 may be formed in a method of depositing an oxide layer by CVD, or oxidizing the nitride layer 23.

Figure 3C:
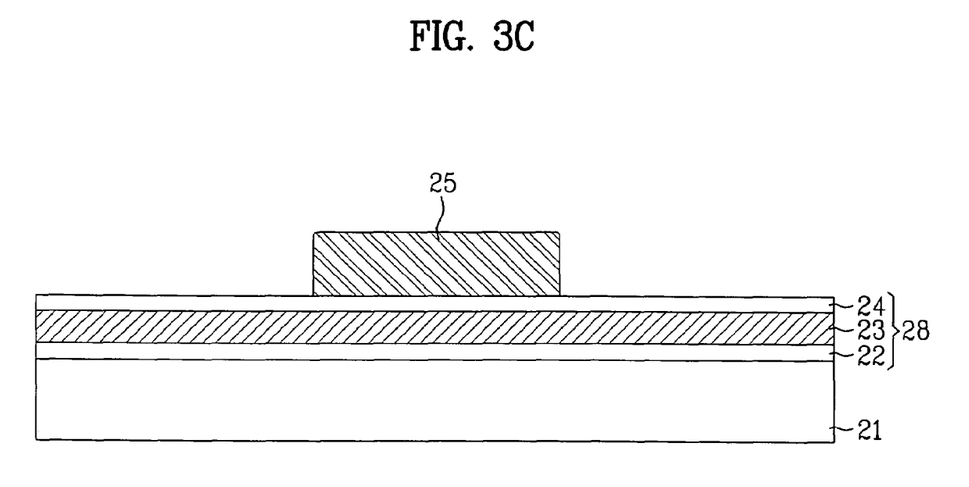

As shown in FIG. 3C, a photosensitive layer (not shown) is formed on the first polysilicon layer 25a, and then the exposure and development process using a mask is carried out thereto, whereby the first polysilicon layer 25a is selectively removed to form a first control gate 25. Thereafter, the photosensitive layer is removed. After patterning the first control gate 25, the cleaning process is carried out.

Figure 3D:
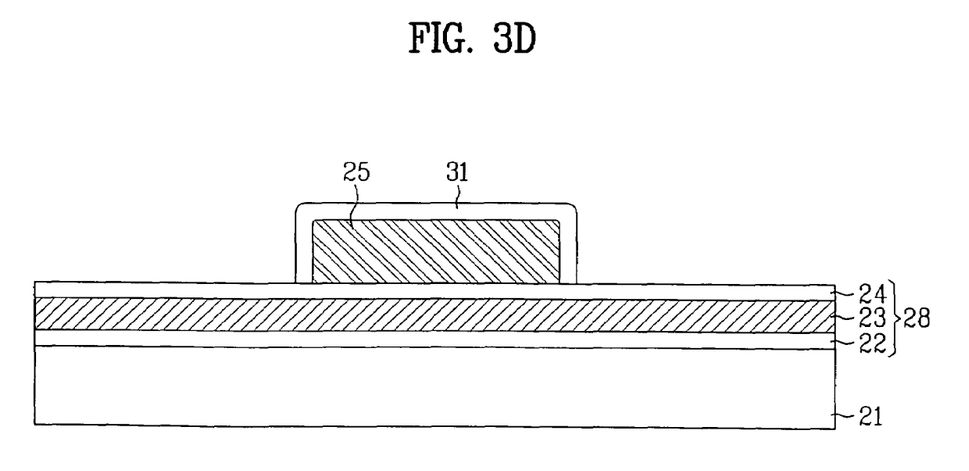
Figure 3E:
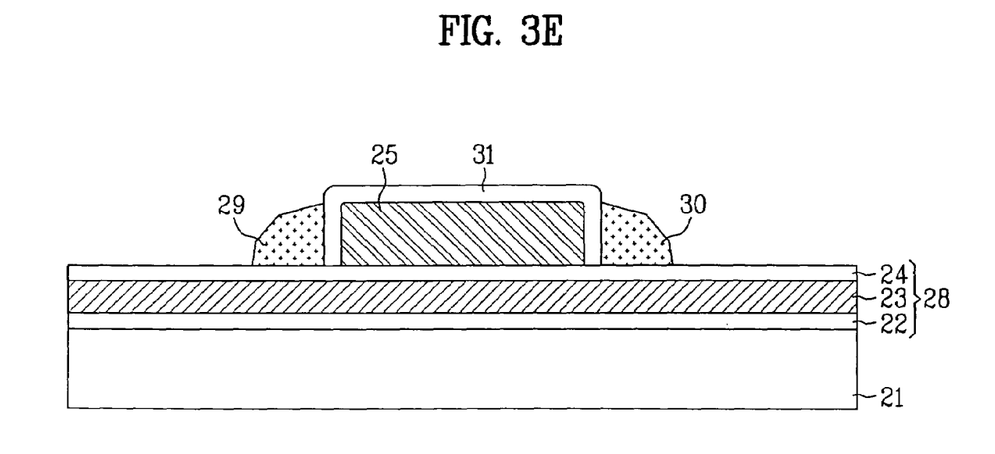

After that, as shown in FIG. 3D, the exposed surface of the first control gate 25 is oxidized, thereby forming an oxide layer 31 covering the side portions and the upper surface of the first control gate 25. Then, as shown in FIG. 3E, a second polysilicon layer (not shown) is formed on the entire surface of the semiconductor substrate 21 including the oxide layer 31 and the first control gate 25, and then the anisotropic etching process (etch-back process) is carried out, thereby removing the second polysilicon layer, and forming second and third control gates 29 and 30 on the ONO layer 28 in the side portions of the oxide layer 31 at both sides of the first control gate 25.

Figure 3F:
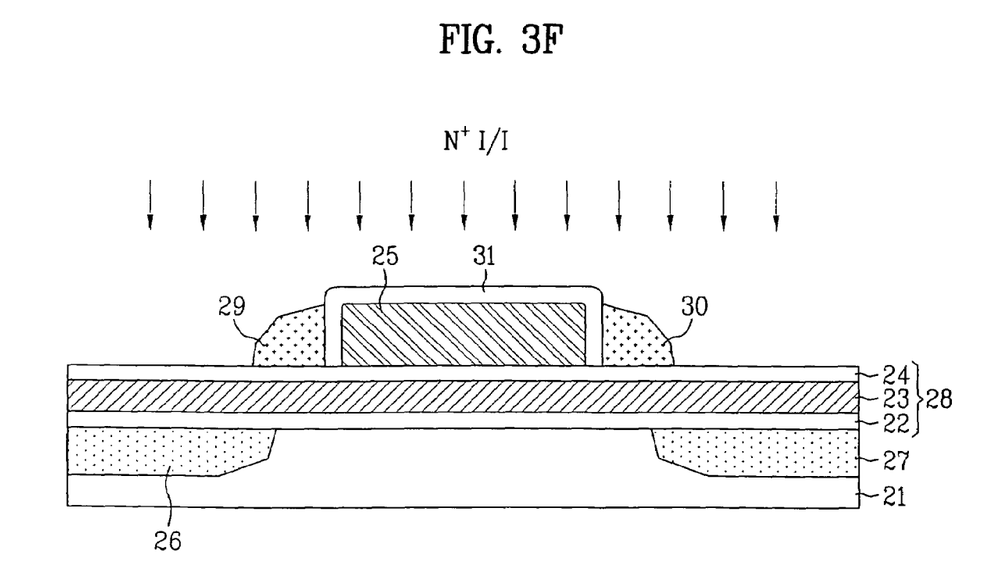

Referring to FIG. 3F, highly doped n-type impurity ions are implanted into the semiconductor substrate 21 by using the first, second and third control gates 25, 29 and 30 as a mask, thereby forming source and drain regions 26 and 27 in the surface of the semiconductor substrate 21 at the side portions of the second and third control gates.

Figure 3G:
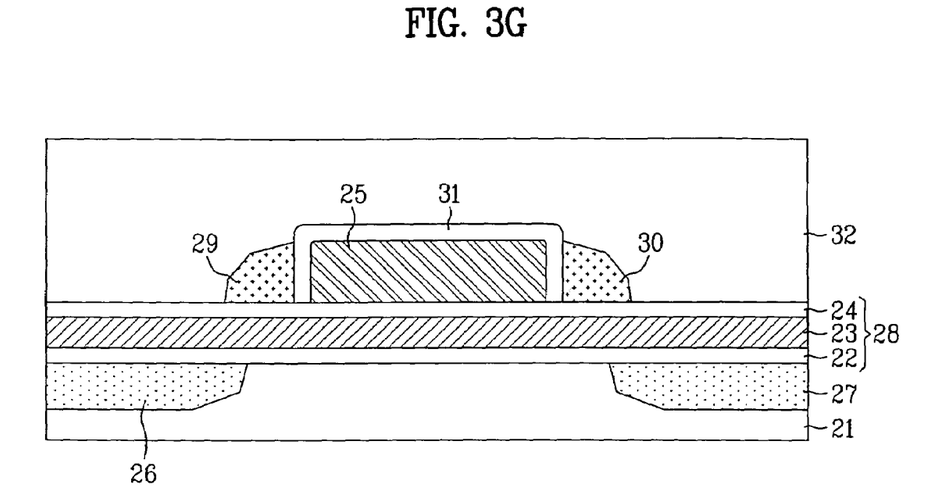
Figure 3H:
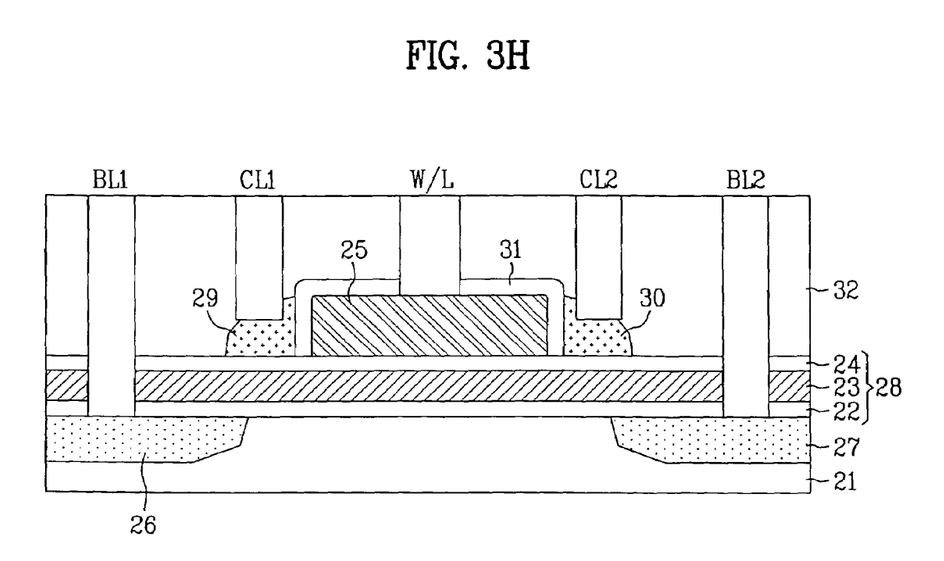

As shown in FIG. 3G, a planarization insulating layer 32 of BPSG is deposited on the entire surface of the semiconductor substrate 21 including the first, second and third control gates 25, 29 and 30. Then, as shown in FIG. 3H, the planarization insulating layer 32 and the ONO layer 28 are selectively removed to expose the first, second and third control gates 25, 29 and 30 and the source and drain regions 26 and 27 by photolithography, thereby forming contact holes. After that, a metal layer is deposited on the entire surface of the semiconductor substrate, and selectively removed, whereby a word line WL and first, second control lines CL1 and CL2 and first and second bit lines BL1 and BL2 are respectively connected with the first, second and third control gates 25, 29 and 30, and the source region 26 and the drain regions 27 through the respective contact holes.

Hereinafter, programming/erasing and reading operations of the aforementioned flash memory device will be described in detail.

On the data programming operation in the flash memory device, programming and programming electrical anneal are repetitively performed. That is, 0V is applied to the first bit line BL1, a voltage over the threshold voltage is applied to the first control line CL1, a voltage pulse (several tens μs) over 10V is applied to the word line W/L and the second control line CL2, and a voltage over 4V is applied to the second bit line BL2, whereby channel electrons are accelerated by a lateral electric field formed from the source region 26 to the drain region 27, thereby generating hot electrons around the drain region 27. The hot electrons jump over the potential barrier of the first oxide layer 22, and then the hot electrons are locally trapped to a trap level of the nitride layer 23 around the drain region 27.

Also, the programming electrical anneal is performed to trap electrons to the nitride layer 23, and to remove the electrons moved to the lateral side among the trapped electrons. That is, 0V is applied to the first and second bit lines BL1 and BL2, the voltage pulse (several tens μs) of −4V is applied to the second control line CL2, and the voltage pulse (several tens ms) of −10V is applied to the word line W/L, so that the electrons moved to the lateral side are removed. At this time, even if the voltage pulse (several tens ms) of −10V is applied to the word line W/L, it is possible to remove only the electrons moved to the lateral side without the effect on the electrons trapped to the nitride layer 23 around the drain region 27, as shown in FIG. 2, since the voltage pulse of −4V is applied to the third control gate 30.

As described above, to program 2-bit data in a unit cell, it is required to trap the electrons to the insulating layer 23 around the drain region 27, to apply the voltage over 4V to the first bit line BL1, to apply the voltage over the threshold voltage to the second control line CL2, to apply the voltage pulse (several tens μs) over 10V to the word line W/L and the first control line CL1, and to apply 0V to the second bit line BL2. As a result, the channel electrons are accelerated by the lateral electric field formed from the drain region 27 to the source region 26, whereby the channel electrons around the source region 26 become the hot electrons. The hot electrons jump over the potential barrier of the first oxide layer 22, so that the hot electrons are locally trapped to the trap level of the nitride layer 23 around the source region 26, thereby programming 1-bit data.

If 2-bit data is programmed, in which the electrons are separately trapped to the nitride layer 23 around the source and drain regions 26 and 27, the programming electrical anneal is performed as follows. That is, 0V is applied to the first and second bit lines BL1 and BL2, the voltage pulse (several tens μs) of −4V is applied to the first and second control lines CL1 and CL2, and the voltage pulse (several tens ms) of −10V is applied to the word line W/L, thereby removing the electrons moved to the lateral side. At this time, even if the voltage pulse (several tens ms) of −10V is applied to the word line W/L, it is possible to remove the electrons (the electrons trapped to the lower side of the first control gate) moved to the lateral side without the effect on the electrons trapped to the nitride layer 23 around the source region 26 and the drain region 27, since the voltage pulse of −4V is applied to the second and third control gates 29 and 30.

On the data erasing operation of the flash memory device, erasing and erasing electrical anneal are repetitively performed. That is, 0V is applied to the first bit line BL1, the voltage over the threshold voltage Vth is applied to the first control line CL1, the voltage pulse (several tens ms) over −3V is applied to the word line W/L and the second control line CL2, and the voltage of 5V or more is applied to the second bit line BL2. As a result, a depletion region is formed in the drain region 27 highly-doped with n-type impurity ions by a high electric field formed in an overlap region between the drain region 27 and the third control gate 30. In the depletion region, pairs of electron and hole are formed by band to band tunneling. The electron escapes to the highly doped n-type impurity region. Also, the hole is accelerated by the lateral electric field formed in the depletion region, and changed to the hot hole, whereby the hot hole jumps over an energy barrier between the first oxide layer 12 and the semiconductor substrate 11, and is injected to a valance band, whereby the erasing operation is completed.

To remove the electrons moved to the lateral side, the erasing electrical anneal is performed. That is, the voltage of 0V is applied to the first and second bit lines BL1 and BL2, the voltage pulse (several tens ms) of 10V is applied to the first and second control lines CL1 and CL2, and the voltage pulse (several tens ms) of −10V is applied to the word line W/L, thereby removing the electrons moved to the lateral side.

As mentioned above, the flash memory device and the programming and erasing methods according to the present invention have the following advantages.

The second and third control gates are formed at both sides of the first control gate. Then, in state of applying the predetermined voltage to the second and third control gates for maintaining the programmed electrons, and applying the high voltage to the first control gate, the electrical annealing is progressed to remove the trapped electrons moved to the lateral side, thereby improving reliability of the flash memory device.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A programming method of a flash memory device of SONOS structure, the flash memory device including second and third control gates at both sides of a first control gate, source and drain regions in a surface of a semiconductor substrate at both sides of the second and third control gates, and ONO layers between the control gates and the semiconductor substrate, comprising:

a first step of applying a high voltage pulse to the first and third control gates, and trapping hot electrons to the ONO layer around the drain region; and a second step of annealing the trapped electrons by applying a high voltage pulse to the first control gate.

2. The programming method of claim 1, wherein in the first step, 0V is applied to the source region, a voltage over a threshold voltage is applied to the second control gate, a voltage pulse of 10V or more is applied to the first and third control gates, and a voltage of 4V or more is applied to the drain region.

3. The programming method of claim 1, wherein, in the second step, 0V is applied to the source and drain region, a voltage of −4V is applied to the second and third control gates, and a voltage pulse of −10V is applied to the first control gate.

4. The programming method of claim 1, further comprising a third step of trapping hot electrons to the ONO layer around the source region by applying a high voltage pulse to the first and second control gates.

5. An erasing method of flash memory device of SONOS structure, the flash memory device including second and third control gates at both sides of a first control gate, source and drain regions in a surface of a semiconductor substrate at both sides of the second and third control gates, and ONO layers between the control gates and the semiconductor substrate, comprising:

a first step of injecting a hole to the ONO layer around the source or drain region by applying a negative voltage to the second and third control gate; and a second step of annealing the injected hole by applying a positive high voltage pulse to the first control gate, and applying a negative high voltage pulse to the second and third control gates.

6. The erasing method of claim 5, wherein, in the first step, a voltage over 0V or 5V is applied to the source or drain region, a voltage over a threshold voltage is applied to the second or third control gate, and a voltage pulse of −3V or more is applied to the first/third or second control gate.

7. The erasing method of claim 5, wherein, in the second step, 0V is applied to the source and drain regions, a voltage pulse of 10V is applied to the second and third control gates, and a voltage pulse (several tens ms) of −10V is applied to the first control gate, thereby removing electrons moved to a lateral side.

* * * * *